(12) United States Patent
Kumar et al.

(10) Patent No.: US 12,034,449 B2
(45) Date of Patent: Jul. 9, 2024

(54) ADAPTIVE CLOCK SIGNAL MANAGEMENT

(71) Applicant: TEXAS INSTRUMENTS INCORPORATED, Dallas, TX (US)

(72) Inventors: G Anand Kumar, Bangalore (IN); Srinivasa Chakravarthy, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/977,263

(22) Filed: Oct. 31, 2022

(65) Prior Publication Data

US 2023/0299778 A1    Sep. 21, 2023

(30) Foreign Application Priority Data

Mar. 21, 2022 (IN) .............................. 202241015314

(51) Int. Cl.
| | |
|---|---|
| *H03L 7/24* | (2006.01) |
| *G06F 1/08* | (2006.01) |
| *G06F 1/3296* | (2019.01) |
| *H03M 1/12* | (2006.01) |

(52) U.S. Cl.
CPC ................. *H03L 7/24* (2013.01); *G06F 1/08* (2013.01); *G06F 1/3296* (2013.01); *H03M 1/1245* (2013.01)

(58) Field of Classification Search
CPC ........... H03L 7/24; G06F 1/08; G06F 1/3296; H03M 1/1245
See application file for complete search history.

(56) References Cited

U.S. PATENT DOCUMENTS

| | | | |
|---|---|---|---|
| 8,508,308 B2 * | 8/2013 | Dong ........................ | H03L 7/08 331/10 |
| 9,362,893 B2 * | 6/2016 | Walker .................... | H03K 3/012 |
| 10,931,292 B1 * | 2/2021 | Shalmani ............ | H03M 1/1033 |
| 2017/0264308 A1 * | 9/2017 | Danson ............... | H03M 1/1245 |

\* cited by examiner

*Primary Examiner* — John W Poos
(74) *Attorney, Agent, or Firm* — Brian D. Graham; Frank D. Cimino (57) ABSTRACT

Various embodiments disclosed herein relate to adaptive clock signal management, and more specifically to generating a clock signal at desired frequencies based on inputs to a clock subsystem for peripheral use. A clock subsystem is provided herein that comprises an oscillator configured to provide a clock signal at either a first frequency or a second frequency, and a controller coupled to the oscillator and configured to perform various functions. The controller can be configured to determine a desired frequency of the clock signal based on a state of each input of multiple inputs, wherein the multiple inputs comprise a power mode input and an analog-to-digital converter input, and provide a signal to the oscillator to produce the clock signal at the desired frequency.

20 Claims, 10 Drawing Sheets

ADAPTIVE CLOCK SIGNAL MANAGEMENT

RELATED APPLICATIONS

This application hereby claims the benefit and priority to India Provisional Patent Application No. 202241015314, titled "ADAPTIVE CLOCK MANAGEMENT FOR SEAMLESS ADC OPERATION IN AND OUT OF LOW-POWER MODE," filed Mar. 21, 2022, which is hereby incorporated in its entirety.

TECHNICAL FIELD

This relates generally to oscillator-generated clock signal management, and more particularly to generating a clock signal at desired frequencies based on inputs to a clock subsystem and converting analog signals to digital signals using the clock signal.

BACKGROUND

Computing devices, such as microcontrollers, often include a high-frequency oscillator configured to generate clock signals used by CPUs or other peripherals to execute CPU operations or other peripheral functions. The CPU or peripheral may require a high frequency clock signal when performing functions, but during other times, the frequency need not be as high. During such non-operation times, the microcontroller can run in a low-power mode where the oscillator generates a lower-frequency clock signal to save power. However, issues arise when toggling between operating modes using traditional methods leading to discontinuity and latency, among other problems.

In conventional implementations, devices can employ multiple oscillators to provide different clock signals and ensure operation of both the device and any peripherals. In one such traditional approach, one oscillator can provide a primary clock signal for system operations, while another can provide a dedicated clock signal to a specific peripheral. The dedicated oscillator ensures continuous operation of the peripheral functions irrespective of the power mode of the device. But this is a costly solution in both money and power. In another traditional implementation, software can be implemented on the device to reconfigure the peripheral functions to operate at suitable sampling rates. However, this also adds extra handling steps in software sequencing and may allow for functional discontinuity of the peripheral operations when the device toggles between operating mode and low power mode. In yet another approach, the peripheral may be operated well below its usual sampling rate during operations so that the clock signal only has to generate one low-frequency clock signal. Problematically, the peripheral may not function properly or efficiently using a below-normal sampling rate. Therefore, the traditional approaches fail to provide an adequate solution to clock signal frequency management.

SUMMARY

Disclosed herein are improvements to clock signal management to provide seamless operation of an analog-to-digital converter. An example embodiment includes a clock subsystem comprising an oscillator configured to provide a clock signal at either a first frequency or a second frequency, and a controller coupled to the oscillator and configured to perform various functions. In this example embodiment, the controller is configured to determine a desired frequency of the clock signal based on a state of each input of multiple inputs, wherein the multiple inputs comprise a power mode input and an analog-to-digital converter input, and provide a signal to the oscillator to produce the clock signal at the desired frequency.

This Summary is provided to introduce a selection of concepts in a simplified form that are further described below in the Detailed Description. It may be understood that this Summary is not intended to identify key features or essential features of the claimed subject matter, nor is it intended to be used to limit the scope of the claimed subject matter.

BRIEF DESCRIPTION OF THE DRAWINGS

The drawings are not necessarily drawn to scale. In the drawings, like reference numerals designate corresponding parts throughout the several views. In some embodiments, components or operations may be separated into different blocks or may be combined into a single block.

DETAILED DESCRIPTION

Discussed herein are enhanced components, techniques, and systems related to oscillator-generated clock signal management. Often, various peripherals of a system (e.g., devices other than a central processing unit (CPU) of a microcontroller unit) use clock signals generated by an oscillator to perform functions. For example, a software application running on a CPU may request conversion of an analog signal to a digital signal. In such an example, an analog-to-digital converter (ADC) may require a high-frequency clock signal (e.g., 32 MHz) from a clock subsystem to convert analog signals to digital signals. When the ADC does not need a high-frequency clock signal, the clock subsystem can reduce the frequency of the clock signal and operate in a low-power mode to save power. However, the clock subsystem may need to quickly transition between power modes, and consequently between clock frequencies, to prevent functional interruption of the ADC, or other peripheral(s). To do so, the clock subsystem may read various inputs to determine a desired frequency for the clock signal and when to transition to that desired frequency. Advantageously, the clock subsystem can provide a clock signal that allows the ADC to maintain an appropriate sampling rate while saving power during other times without software intervention or dedicated oscillator support.

One example embodiment of the disclosed technology includes a clock subsystem comprising an oscillator configured to provide a clock signal at a first frequency and a second frequency, and the controller coupled to the oscillator and configured to perform various functions. For instance, the controller is configured to determine a desired frequency of the clock signal based on a state of each input of multiple inputs, wherein the multiple inputs comprise a power mode input and an analog-to-digital converter input, and provide a signal to the oscillator to produce the clock signal at the desired frequency.

In another example, a system comprising an analog-to-digital converter subsystem and a clock subsystem coupled to the analog-to-digital converter subsystem is provided. In this system, the analog-to-digital converter subsystem is configured to, in response to a trigger to convert an analog signal to a digital signal, request the clock subsystem to produce the clock signal at a desired frequency. The clock subsystem is configured to determine the desired frequency based on the request from the analog-to-digital converter subsystem, produce, via an oscillator unit of the clock subsystem, the clock signal at the desired frequency, and provide the clock signal to the analog-to-digital converter subsystem.

In yet another embodiment, a method is provided. The method comprises, in an analog-to-digital converter, in response to a trigger to convert an analog signal to a digital signal, requesting a clock subsystem to produce a clock signal at a desired frequency. The method further comprises, in the clock subsystem, producing the clock signal at the desired frequency based on the request and providing an indication of the clock signal to the analog-to-digital converter, and in the analog-to-digital converter, in response to determining that the clock signal is at the desired frequency based on the indication, instructing circuitry to convert the analog signal to the digital signal.

Figure 1:
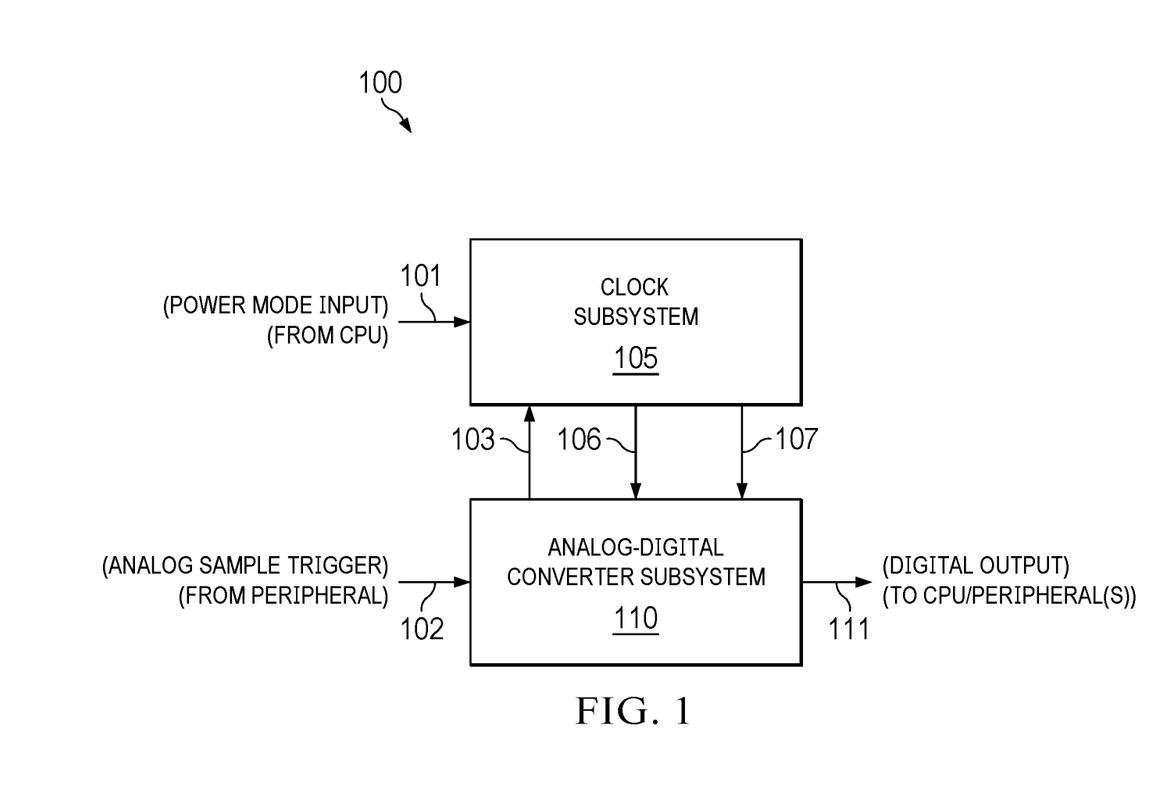
FIG. 1 illustrates an example operating architecture configurable to perform adaptive clock management processes.

FIG. 1 illustrates an example operating architecture configurable to perform adaptive clock management processes. FIG. 1 shows operating architecture 100, which further includes clock subsystem 105 and analog-to-digital converter subsystem 110. Clock subsystem 105 is supplied with power mode input 101 and provides analog-to-digital converter subsystem 110 with clock signal 107. Analog-to-digital converter subsystem 110 uses clock signal 107 to convert an analog signal to digital output 111. Both clock subsystem 105 and analog-to-digital converter subsystem 110 may be configured to execute clock management processes, such as process 200 of FIG. 2, to generate a clock signal at a desired frequency. In various examples, the components of operating architecture 100 are coupled to or are operated by a microcontroller unit (MCU) comprising a central processing unit (CPU), among other components.

In operation, clock subsystem 105 is configured to determine a desired frequency of a clock signal based on multiple inputs and to generate the clock signal at the desired frequency. For example, clock subsystem 105 reads a state of each of the multiple inputs provided to it, determines the desired frequency based on the states, generates clock signal 107 at that frequency, and provides clock signal 107 to analog-to-digital converter subsystem 110. Analog-to-digital converter subsystem 110 can then use clock signal 107 to convert and/or sample one or more analog signals to one or more digital signals.

Analog-to-digital converter subsystem 110 is representative of one or more components capable of converting analog signals to digital signals. In various examples, analog-to-digital converter subsystem 110 has circuitry and a controller coupled to the circuitry and configured to instruct the circuitry to convert an analog signal based on analog sample trigger 102. Analog-to-digital converter subsystem 110 receives analog sample trigger 102 from a peripheral (e.g., a software application or a device or system other than a CPU) requesting conversion of the analog signal. Analog-to-digital converter subsystem 110 then, in response to analog sample trigger 102, submits request 103 to clock subsystem 105 for a clock signal at a desired frequency so that analog-to-digital converter subsystem 110 can operate at a necessary sampling rate during the conversion operation.

Clock subsystem 105 includes an oscillator configured to produce the clock signal at multiple different frequencies (e.g., a first frequency and a second frequency) and a controller coupled to the oscillator and configured to control the oscillator based on multiple inputs including request 103. In addition to request 103, clock subsystem 105 may also be supplied with power mode input 101. Power mode input 101 can be provided by a CPU, or any other processing device, configured to execute program instructions related to operation of clock subsystem 105, among other functions. Power mode input 101 indicates an operating mode of clock subsystem 105, such as a run-mode and a low-power mode. Run-mode refers to a regular power mode whereby clock subsystem 105 generates a high-frequency clock signal (e.g., 32 MHz). Low-power mode refers to a power-saver mode whereby clock subsystem 105 generates a low-frequency clock signal (e.g., 4 MHz). In either mode, clock subsystem 105 is configured to provide clock signal 107 to at least analog-to-digital converter subsystem 110.

Clock subsystem 105 next determines a desired frequency of the clock signal (e.g., clock signal 107) based on power mode input 101 and request 103. In various examples, because request 103 indicates desired operation of analog-to-digital converter subsystem 110, clock subsystem 105 can determine that the desired frequency is a high-frequency (e.g., 32 MHz) to allow analog-to-digital converter subsystem 110 to perform conversion functionality. Regardless of the current frequency of clock signal 107 being produced by clock subsystem 105, clock subsystem 105 can transition clock signal 107 to the desired frequency (if it is not already at the desired frequency). After generating clock signal 107 at the desired frequency, clock subsystem 105 can provide clock signal 107, at the desired frequency, to one or more components of analog-to-digital converter subsystem 110.

Clock subsystem 105 can also provide indication 106 to analog-to-digital converter subsystem 110. Indication 106 indicates that clock signal 107 is at the desired frequency. In some cases, indication 106 may be an acknowledgement provided in response to request 103. In other cases, indication 106 may be a reference of the frequency value that identifies whether clock signal 107 is "high" (i.e., at 32 MHz, or another desired frequency) or not. After receiving indication 106, analog-to-digital converter subsystem 110 can use clock signal 107 to convert an analog signal and produce digital output 111. More specifically, the controller of analog-to-digital converter subsystem 110 can select an analog signal from one or more analog signals and hold the selected analog signal until the controller receives indication 106. Then, the controller can provide the selected analog signal to the circuitry for conversion. The circuitry may receive clock signal 107 directly from the oscillator of clock subsystem 105 or it may receive clock signal 107 from the controller of analog-to-digital converter subsystem 110. Regardless, the circuitry then produces digital output 111 using the selected analog signal and clock signal 107. Analog-to-digital converter subsystem 110 can then provide digital output 111 to downstream subsystems/peripherals and/or the CPU.

Figure 2:
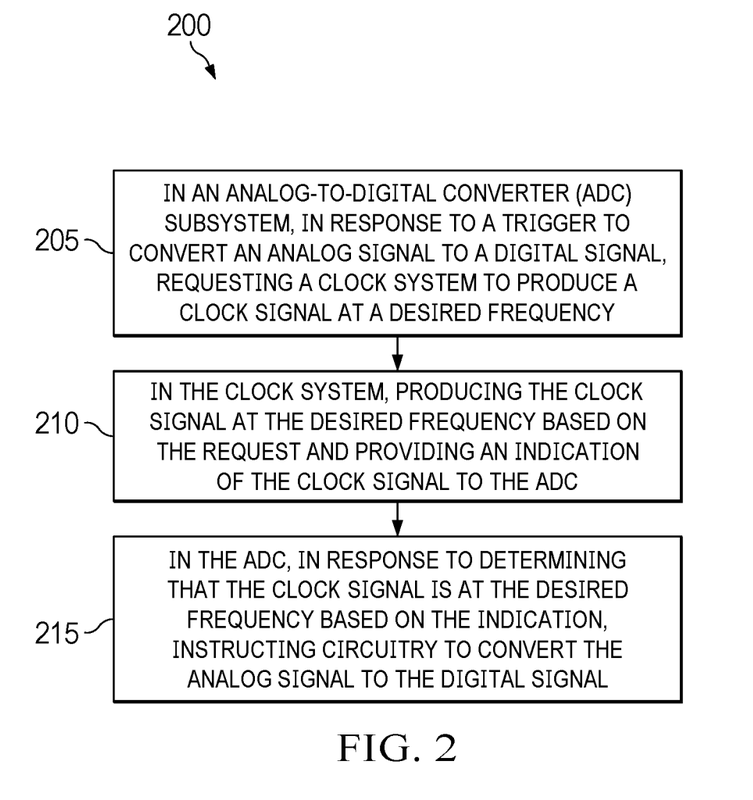
FIG. 2 illustrates a series of steps for transitioning the frequency of a clock signal produced by an oscillator of a system.

Moving to FIG. 2, FIG. 2 illustrates a series of steps for transitioning the frequency of a clock signal produced by an oscillator unit of a system. FIG. 2 includes process 200 described parenthetically below, which references elements of FIG. 1. Process 200 can be implemented on fixed-purpose, dedicated hardware. For example, process 200 can be executed on or by a clock subsystem and/or an analog-to-digital converter subsystem, such as one or more components of operating architecture 100 of FIG. 1, or another apparatus, device, or system.

In operation 205, in response to analog sample trigger 102 to convert an analog signal to a digital signal, analog-to-digital converter subsystem 110 provides request 103 (205) to clock subsystem 105 requesting clock subsystem 105 to produce a clock signal at a desired frequency. Analog-to-digital converter subsystem 110 generates request 103 based on analog sample trigger 102. Analog-to-digital converter subsystem 110 receives analog sample trigger 102 from a peripheral, such as a software application or another device or system other than a CPU, requesting conversion of an analog signal.

In operation 210, clock subsystem 105 produces (210) clock signal 107 at the desired frequency based on request 103 and provides indication 106 of the clock signal to analog-to-digital converter subsystem 110. Clock subsystem 105 includes an oscillator capable of producing the clock signal at multiple different frequencies and a controller coupled to the oscillator and capable of controlling the oscillator based on multiple inputs including request 103. Clock subsystem 105 determines the desired frequency of clock signal 107 based on request 103, among other inputs. Because the request 103 indicates desired operation of analog-to-digital converter subsystem 110, clock subsystem 105 may determine the desired frequency to be a high-frequency (e.g., 32 MHz) so that analog-to-digital converter subsystem 110 can perform conversion functionality. Regardless of the current frequency of clock signal 107 being produced by clock subsystem 105, clock subsystem 105 can transition clock signal 107 to the desired frequency. After generating clock signal 107 at the desired frequency, clock subsystem 105 can provide clock signal 107, at the desired frequency, to one or more components of analog-to-digital converter subsystem 110, and clock subsystem can also provide indication 106 to analog-to-digital converter subsystem 110. Indication 106 indicates that clock signal 107 is at the desired frequency. In some cases, indication 106 may be an acknowledgement provided in response to request 103. In other cases, indication 106 may be a reference of the frequency value that indicates whether clock signal 107 is "high" (i.e., at 32 MHz) or not.

Lastly, in operation 215, in response to determining that clock signal 107 is at the desired frequency based on indication 106, analog-to-digital converter subsystem 110 instructs circuitry coupled to analog-to-digital subsystem 110 to convert the analog signal to the digital signal to produce digital output 111. In various instances, analog-to-digital subsystem 110 has a controller coupled to the circuitry and configured to provide a signal to the circuitry to perform conversion operations on one or more analog signals. More specifically, the controller can intake several analog signals and select at least one of the analog signals to be converted. After receiving indication 106, the controller can be further configured to hold the selected analog signal. Once the controller reads indication 106, the controller provides the selected analog signal to the circuitry. Meanwhile, the circuitry may receive clock signal 107 directly from the oscillator of clock subsystem 105; however, it does not perform a conversion until it receives instruction and the selected analog signal from the controller. Once the controller receives the instructions and the selected analog signal, the circuitry performs at a sampling rate determined by the desired clock frequency of clock signal 107 to produce digital output 111. The circuitry can then provide digital output 111 to downstream peripheral and/or a CPU.

Figure 3:
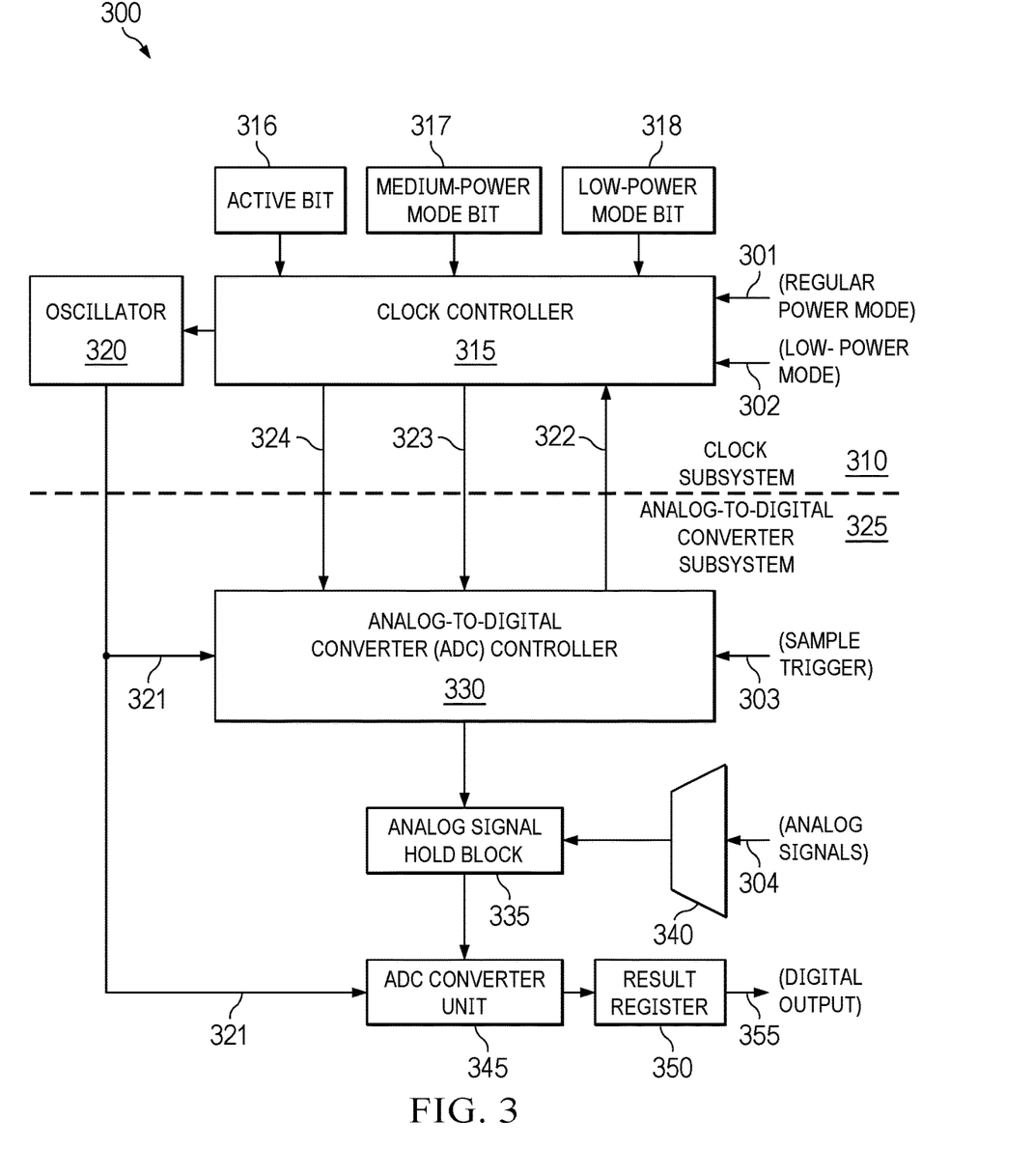
FIG. 3 illustrates an example operating environment for adaptive clock management and analog-to-digital conversion.

FIG. 3 illustrates an example operating environment for adaptive clock management and analog-to-digital conversion. FIG. 3 includes operating environment 300 which further includes clock subsystem 310 and analog-to-digital converter subsystem 325. Clock subsystem 310 includes clock controller 315, digital logic inputs, such as active bit 316, medium-power mode bit 317, and low-power mode bit 318, and oscillator 320. Analog-to-digital converter subsystem 325 includes analog-to-digital converter (ADC) controller 330, analog signal hold block 335, multiplexer (MUX) 340, analog-to-digital converter (ADC) unit 345, and result register 350. Clock subsystem 310 and analog-to-digital converter subsystem 325 and the components thereof may be representative of clock subsystem 105 and analog-to-digital converter subsystem 110 of FIG. 1.

In operation, clock subsystem 310 is configured to determine a desired frequency of a clock signal based on multiple inputs and to generate the clock signal at the desired frequency. For example, clock subsystem 310 reads a state of each of the multiple inputs provided to it, determines the desired frequency based on the states, generates clock signal 321 at that frequency, and provides clock signal 321 to analog-to-digital converter subsystem 325. Analog-to-digital converter subsystem 325 can then use clock signal 321 to convert and/or sample one or more analog signals to one or more digital signals.

Analog-to-digital converter subsystem 325 has various components capable of receiving analog signals, reading requests to convert the analog signals, selecting an analog signal to be converted, and converting the selected analog signal to a digital signal, among other functions. First, ADC controller 330 is configured to receive sample trigger 303 from a peripheral (e.g., a software application or a device or system other than a CPU) requesting conversion of an analog signal. ADC controller 330, in response to sample trigger 303, submits request 322 to clock controller 315 of clock subsystem 310 requesting a clock signal at a desired frequency. Similarly, MUX 340 is configured to receive analog signals 304 and to select the analog signal from analog signals 304.

In response to request 322 from ADC controller 330, clock controller 315 reads a state of each input of multiple inputs, including request 322 and other inputs, to determine the desired frequency of clock signal 321. The other inputs include a power mode input, such as regular power mode 301 and low-power mode 302, and digital logic inputs, such as active bit 316, medium-power mode bit 317, and low-power mode bit 318. The power mode inputs indicate an operating mode of clock subsystem 310 and can be supplied by a CPU configured to execute program instructions related to operation of clock subsystem 310, among other functions. Regular power mode 301 refers to a run-mode state whereby oscillator 320 is configured to generate a high-frequency clock signal (e.g., 32 MHz). Low-power mode 302 refers to a power-saver mode state whereby oscillator 320 is configured to generate a low-frequency clock signal (e.g., 4 MHz).

The digital logic inputs each indicate a frequency setting that can influence the clock signal frequency. The frequency settings controlled by the digital logic inputs can override the clock signal frequency when regular power mode 301 is selected and/or when low-power mode 302 is selected. For example, when medium-power mode bit 317 is in an "on" state, clock controller 315 can instruct oscillator 320 to generate clock signal 321 at 16 MHz while regular power mode 301 is on (as opposed to 32 MHz). However, if active bit 316 is also in an "on" state, clock controller 315 may override medium-power mode bit 317 and instruct oscillator 320 to generate clock signal 321 at 32 MHz while regular power mode 301 is on. In another example, when low-power mode bit 318 is in an "on" state, clock controller 315 can instruct oscillator 320 to generate clock signal 321 at 32 MHz while low-power mode 302 is on (as opposed to 4 MHz). Regardless, oscillator 320 can persistently provide clock signal 321 at one of multiple frequencies based on the multiple inputs.

In various examples, because request 322 indicates a desired conversion operation via ADC converter unit 345, clock controller 315 can determine the desired frequency to be a high clock frequency (e.g., 32 MHz) so that ADC converter unit 345 can execute conversion functionality. Regardless of the current frequency of clock signal 321 being produced by oscillator 320, clock controller 315 can instruct oscillator 320 to transition clock signal 321 to the desired frequency. After generating clock signal 321 at the desired frequency, oscillator 320 can provide clock signal 321, at the desired frequency, to ADC controller 330 and ADC converter unit 345. Concurrently, clock controller 315 can also provide acknowledgement 324 to ADC controller 330. Acknowledgement 324 is an indication that clock controller 315 has instructed oscillator 320 to generate clock signal 321 at the desired frequency based on request 322. Once ADC controller 330 receives acknowledgement 324, it can instruct analog signal hold block 335 to temporarily hold the selected analog signal (from MUX 340) before passing the signal to ADC converter unit 345.

At any point while oscillator 320 is providing clock signal 321, ADC controller 320 can obtain frequency reference 323 to determine a current frequency of clock signal 321. Frequency reference 323 is an indication of whether clock signal 321 is "high," or at 32 MHz, or not. In some cases, when clock signal 321 is already at the desired frequency, and consequently, frequency reference 323 provides the indication thereof, ADC controller 330 can immediately instruct analog signal hold block 335 to send ADC converter unit 345 the analog signal to be converted and initiates the sample and convert operation. In such cases, ADC controller 330 need not wait to receive acknowledgement 324 because clock signal 321 is already at the desired frequency per frequency reference 323. However, in other cases when frequency reference 323 does not indicate that clock signal 321 is at the desired frequency, ADC controller 330 does not instruct analog signal hold block 335 to pass the analog signal on to initiate sample and convert operation until ADC controller 330 receives acknowledgement 324.

Once ADC converter unit 345 receives the analog signal from analog signal hold block 335, ADC converter unit 345 can use clock signal 321 to convert the analog signal. ADC converter unit 345 can then provide the digital signal to result register 350, which can further provide digital output 355 to one or more downstream peripherals and/or to a CPU.

Figure 4A:
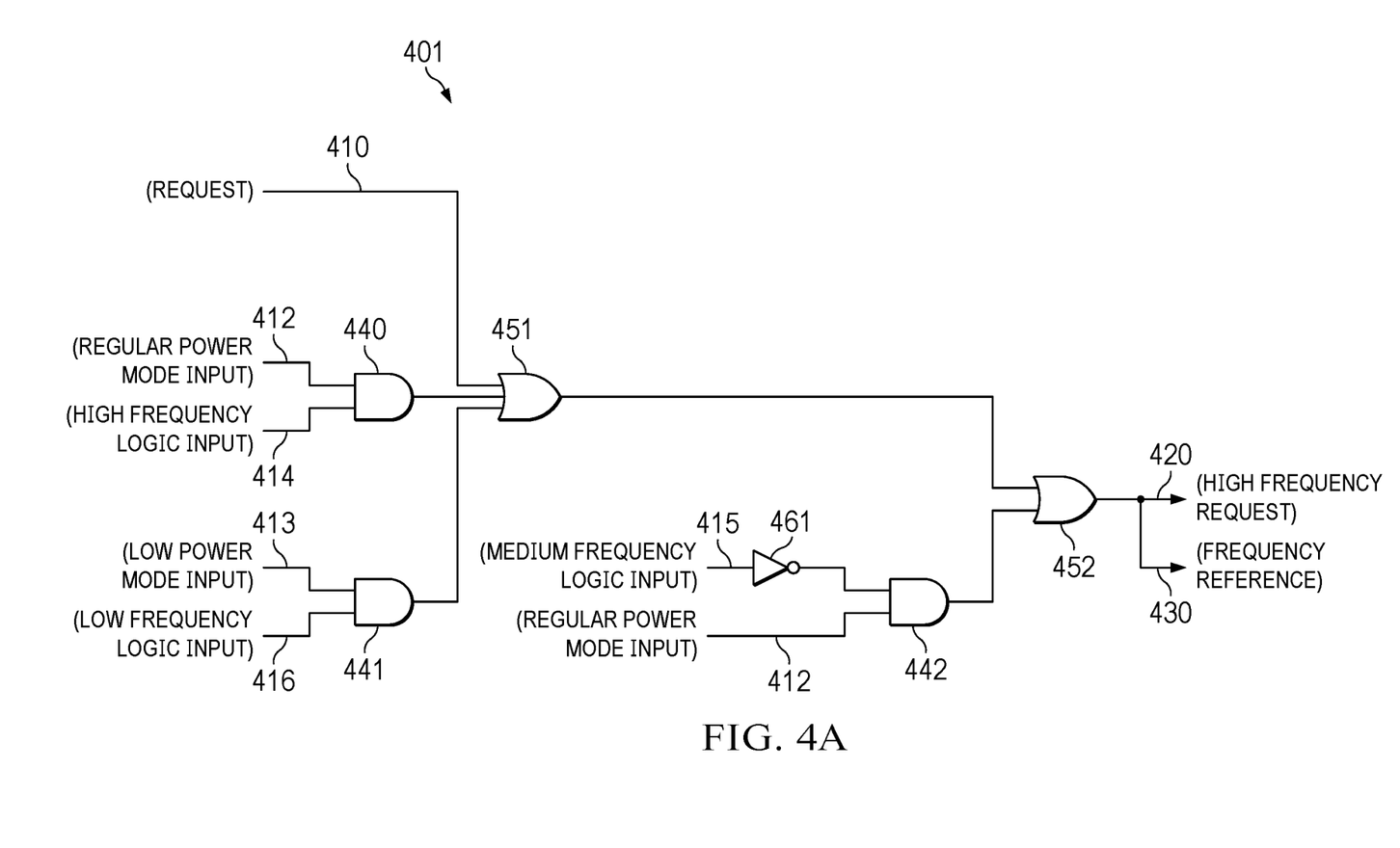
FIGS. 4A, 4B, and 4C illustrate example aspects of adaptive clock management based on various inputs.
Figure 4B:
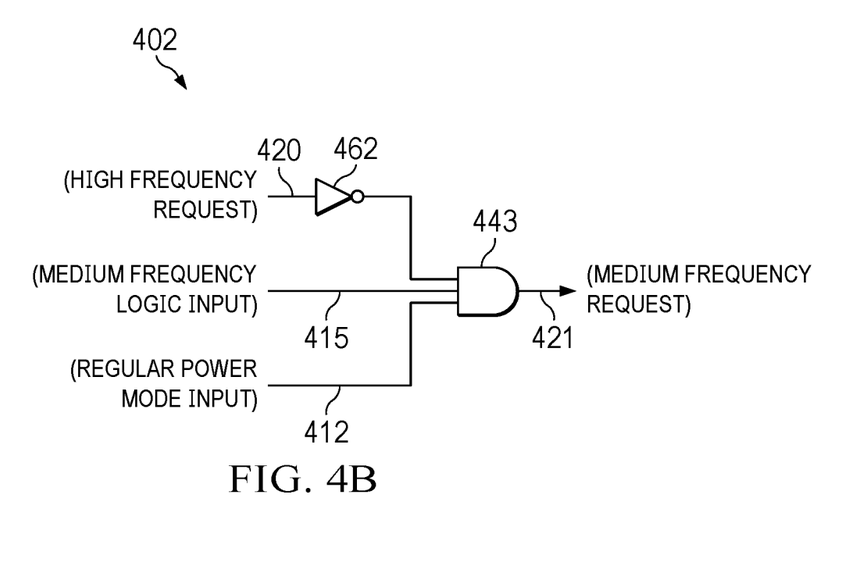
Figure 4C:
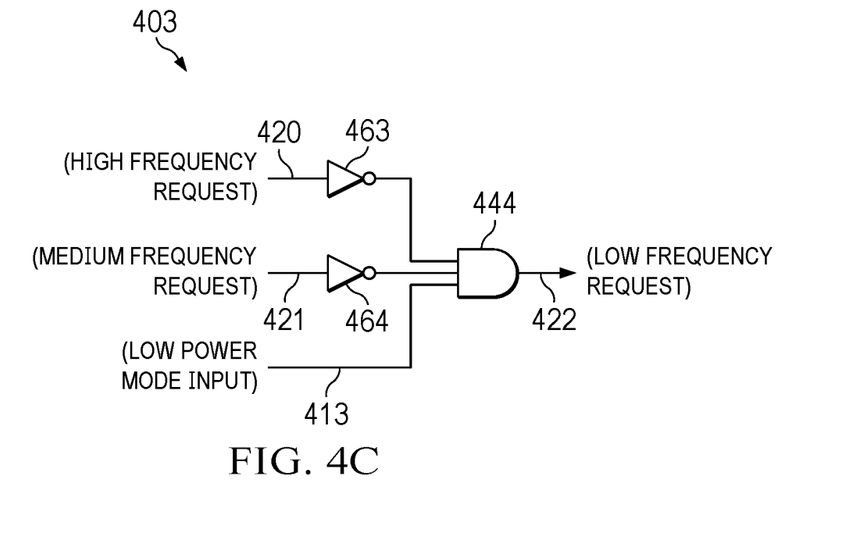

FIGS. 4A, 4B, and 4C illustrates example aspects of adaptive clock management based on various inputs. FIGS. 4A, 4B, and 4C include aspects 401, 402, and 403, respectively, which demonstrate exemplary digital logic functionality that may be used in an implementation. Each aspect includes digital logic gates configured to intake inputs and produce outputs based on the inputs (e.g., "on"/"1" or "off"/"0"). The aspects shown may be executed on or by a clock subsystem or another apparatus, such as clock subsystem 105 of FIG. 1 or clock subsystem 310 of FIG. 3.

Aspects 401, 402, and 403 demonstrate inputs to a clock controller of a clock subsystem and the outputs produced by the clock controller based on various combinations of the inputs. The inputs include power mode inputs, digital logic inputs, and analog-to-digital converter subsystem inputs. The power mode inputs indicate an operating mode of the clock subsystem. Regular power mode input 412 refers to a run-mode state, and based on reading regular power mode input 412, a clock controller requests an oscillator to generate a high-frequency clock signal (e.g., 32 MHz). Low-power mode input 413 refers to a power-saver mode state, and based on reading low-power mode input 413, the clock controller requests the oscillator to generate a low-frequency clock signal (e.g., 4 MHz).

Digital logic inputs each indicate a frequency setting that can influence the clock signal frequency during either or both power mode inputs. For example, the digital logic inputs can be provided by a computing device or digital logic circuitry. The digital logic inputs include high frequency logic input 414, medium frequency logic input 415, and low frequency logic input 416. High frequency logic input 414 and medium frequency logic input 415 can cause the clock controller to request a high frequency clock signal (e.g., 32 MHz) and a medium frequency clock signal (e.g., 16 MHz), respectively, when regular power mode input 412 is in an "on" state. Similarly, low frequency logic input 416 can cause the clock controller to request a high frequency clock signal (e.g., 32 MHz) when low power mode input 413 is in an "on" state instead of requesting a low frequency clock signal (e.g., 4 MHz).

In aspect 401 of FIG. 4A, regular power mode input 412 and high frequency logic input 414 are first supplied to a digital logic gate, AND gate 440. Concurrently, low power mode input 413 and low frequency logic input 416 are supplied to AND gate 441. If both regular power mode input 412 and high frequency logic input 414 are "on," AND gate 440 outputs an "on" signal and supplies OR gate 451 with the "on" as an input. Similarly, OR gate 451 can be supplied with another "on" input from AND gate 441 if both low power mode input 413 and low frequency logic input 416 are "on."

In addition to the "on" inputs provided by AND gates 440 and 441, request 410, a request to the clock controller to produce a clock signal at a desired frequency (e.g., request 322 of FIG. 3), is also supplied to OR gate 451. If any of the inputs to OR gate 451 are "on," then OR gate 451 can output "on" which is fed to a further OR gate, OR gate 452. If OR gate 451 produces an output in an "on" state, then the clock controller is configured to request a high-frequency clock signal. This is because, in part, either a digital logic input, an analog-to-digital converter input, or a power mode input request a high frequency.

Meanwhile, medium frequency logic input 415 is fed to NOT gate 461. The output of NOT gate 461 and the indication of regular power mode input 412 are supplied to AND gate 442. The output of AND gate 442 determines whether medium frequency logic input 415 is "off" and whether regular power mode input 412 is "on." If both are true, AND gate 442 can produce an output signaling "on" to the remaining digital logic gate, OR gate 452.

Finally, the output AND gate 442 and the output of OR gate 451 are fed to OR gate 452. If the output from OR gate 451 is "on," and/or the output from AND gate 442 is "on," then high frequency request 420 and frequency reference 430 are produced. High frequency request 420 is a request produced by the clock controller and provided to the oscillator to generate a high frequency clock signal. Frequency reference 430 is an indication of whether the clock signal is at a high frequency or not. In aspect 401, because clock controller ultimately produces high frequency request 420 based on the multiple inputs, frequency reference 430 can indicate that the oscillator is producing a high frequency clock signal. In this way, frequency reference 430 can be used by an ADC controller (e.g., ADC controller 330) to determine when to perform a conversion.

The following table demonstrates the combination of inputs and outputs to each of the digital logic gates of aspect 401 to produce high frequency request 420 and frequency reference 430, whereby "1" represents an "on" signal, "0" represents an "off" signal, and "X" can be either "on" or "off":

In aspect 403 of FIG. 4C, high frequency request 420 and medium frequency request 421 are supplied to NOT gates 463 and 464, respectively. The NOT gate outputs are fed into AND gate 444 along with low power mode input 413. AND gate 444 determines whether high frequency request 420 is "off," whether medium frequency request 421 is "off," and whether low power mode input 413 is "on." If all inputs align, then AND gate 444 produces low frequency request 422. Low frequency request 422 is provided by the clock controller to the oscillator and instructs the oscillator to generate a low frequency clock signal (e.g., 4 MHz) to save power, for example.

The following table demonstrates the combination of inputs and outputs to AND gate 444 of aspect 403 to produce

TABLE 1

Inputs and outputs to digital logic gates of Aspect 401

| | Inputs | | | | | Outputs | |
|---|---|---|---|---|---|---|---|
| Request 410 | Reg. Power Mode Input 412 | High Freq. Logic Input 414 | Medium Freq. Logic Input 415 | Low Freq. Logic Input 416 | Low Power Mode Input 413 | High Freq. Request 420 | Freq. Reference 430 |
| 1 | X | X | X | X | X | 1 | 1 |
| X | 1 | 1 | X | X | X | 1 | 1 |
| X | X | X | X | 1 | 1 | 1 | 1 |
| X | 1 | X | 0 | X | X | 1 | 1 |
| All Others | | | | | | 0 | 0 |

In aspect 402 of FIG. 4B, high frequency request 420 is supplied to NOT gate 462. The output of NOT gate 462 is supplied to AND gate 443 with medium frequency logic input 415 and regular power mode input 412. AND gate 443 determines whether high frequency request 420 is "off," whether medium frequency logic input 415 is "on," and whether regular power mode input 412 is "on." Depending on the states of the inputs, AND gate 443 can produce medium frequency request 421.

Medium frequency request 421 is provided by the clock controller to the oscillator and instructs the oscillator to generate a medium frequency clock signal (e.g., 16 MHz). However, in the case that one of the multiple inputs is in a different state, resulting in an "off" being input to AND gate 440, then medium frequency request 421 may not be generated, as demonstrated by Table 2 below.

Table 2, below, demonstrates the combination of inputs and outputs to AND gate 443 of aspect 402 to produce medium frequency request 421, whereby "1" represents an "on" signal, "0" represents an "off" signal, and "X" can be either "on" or "off":

TABLE 2

Inputs and outputs of digital logic gates of Aspect 402

| Inputs | | | Outputs |
|---|---|---|---|
| High Freq. Request 420 | Reg. Power Mode Input 412 | Med. Frequency Logic Input 415 | Med. Freq. Request 421 |
| 1 | X | X | 0 |
| 0 | 0 | 0 | 0 |
| 0 | 1 | 0 | 0 |
| 0 | 0 | 1 | 0 |
| 0 | 1 | 1 | 1 |
| All Others | | | 0 | low frequency request 422, whereby "1" represents an "on" signal, "0" represents an "off" signal, and "X" can be either "on" or "off":

TABLE 3

Inputs and outputs of digital logic gates of Aspect 403

| Inputs | | | Outputs |
|---|---|---|---|
| High Freq. Request 420 | Medium Freq. Request 421 | Low Power Mode Input 413 | Low Freq. Request 422 |
| 1 | X | X | 0 |
| X | 1 | X | 0 |
| 0 | 0 | 0 | 0 |
| 0 | 0 | 1 | 1 |
| All Others | | | 0 |

Figure 5:
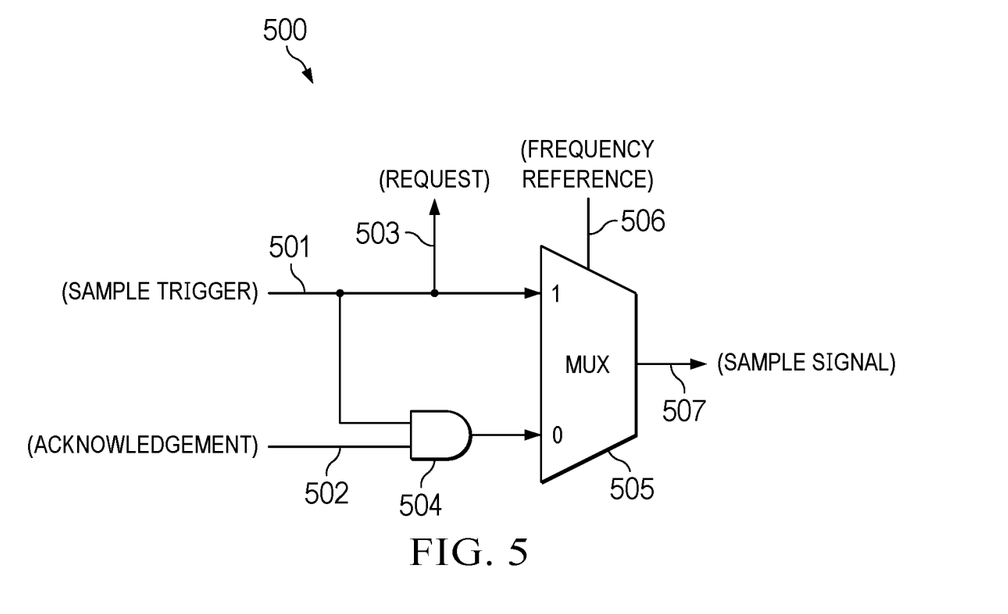
FIG. 5 illustrates an example aspect of adaptive clock management in an analog-to-digital converter subsystem.

FIG. 5 illustrates an example aspect of adaptive clock management in an analog-to-digital converter subsystem. FIG. 5 includes aspect 500, which demonstrates an exemplary digital logic branch that may be used in an implementation. Aspect 500 includes AND gate 504 and multiplexer (MUX) 505 configured to intake inputs and produce an output based on the inputs. Aspect 500 may be executed on or by an analog-to-digital converter subsystem or another apparatus, such as analog-to-digital converter subsystem 110 of FIG. 1 or analog-to-digital converter subsystem 325 of FIG. 3.

In aspect 500, an analog-to-digital converter subsystem receives sample trigger 501 to convert an analog signal to a digital signal. Based on sample trigger 501, the analog-to-digital converter subsystem can output request 503 to a clock subsystem to request a clock signal at a desired frequency. After the clock subsystem generates the clock signal at the desired frequency, the clock subsystem can provide acknowledgement 502 to the analog-to-digital converter subsystem. Both the sample trigger 501 and acknowledgement 502 can be input to AND gate 504. Then, sample trigger 501 and the output of AND gate 504 can be supplied to MUX 505, which can be configured to determine how the sample trigger is provided to the analog-to-digital converter subsystem. MUX 505 can also use frequency reference 506, an indication of the clock signal frequency provided by the clock subsystem, to determine whether the clock signal is at the desired frequency or not. In various examples, MUX 505 provides sample signal 507 downstream once it is provided acknowledgement 502. However, MUX 505 may also provide sample signal 507 downstream in the absence of acknowledgement 502 if frequency reference 506 indicates that the clock signal is already at the desired frequency.

FIGS. 6A, 6B, 6C, and 6D illustrates example graphical representations of adaptive clock management in an implementation. FIGS. 6A, 6B, 6C, and 6D include digital waveforms 601, 602, 603, and 604, respectively. Each waveform represents a digital logic state (i.e., "on" or "off", "1" or "0", "high" or "low") of a component or element of a clock subsystem at different times. In these illustrations, a flat line represents "off," "low," or "0," while a raised waveform represents "on," "high" or "1."

Digital waveforms 601, 602, 603, and 604 demonstrate digital logic states of multiple inputs to a clock controller of a clock subsystem and the effect of the states on components of the clock subsystem across different periods of time. The multiple inputs include power mode inputs, digital logic inputs, and analog-to-digital converter subsystem inputs. The power mode inputs indicate an operating mode of the clock subsystem. Regular power mode input 610 refers to a run-mode state and based on reading an "on" state of regular power mode input 610, a clock controller requests an oscillator to generate a high-frequency clock signal (e.g., 32 MHz). Low-power mode input 611 refers to a power-saver mode state and based on reading an "on" state of low-power mode input 413, the clock controller requests the oscillator to generate a low-frequency clock signal (e.g., 4 MHz).

Digital logic inputs each indicate a frequency setting that can influence the clock signal frequency during either or both power mode inputs. The digital logic inputs include high frequency logic input 612, low frequency logic input 613, and medium frequency logic input 614. High frequency logic input 612 and medium frequency logic input 614 can cause the clock controller to request a high frequency clock signal (e.g., 32 MHz) and a medium frequency clock signal (e.g., 16 MHz), respectively, when regular power mode input 610 is in an "on" state. Similarly, low frequency logic input 613 can cause the clock controller to request a high frequency clock signal (e.g., 32 MHz) when low power mode input 611 is in an "on" state instead of requesting a low frequency clock signal (e.g., 4 MHz).

Figure 6A:
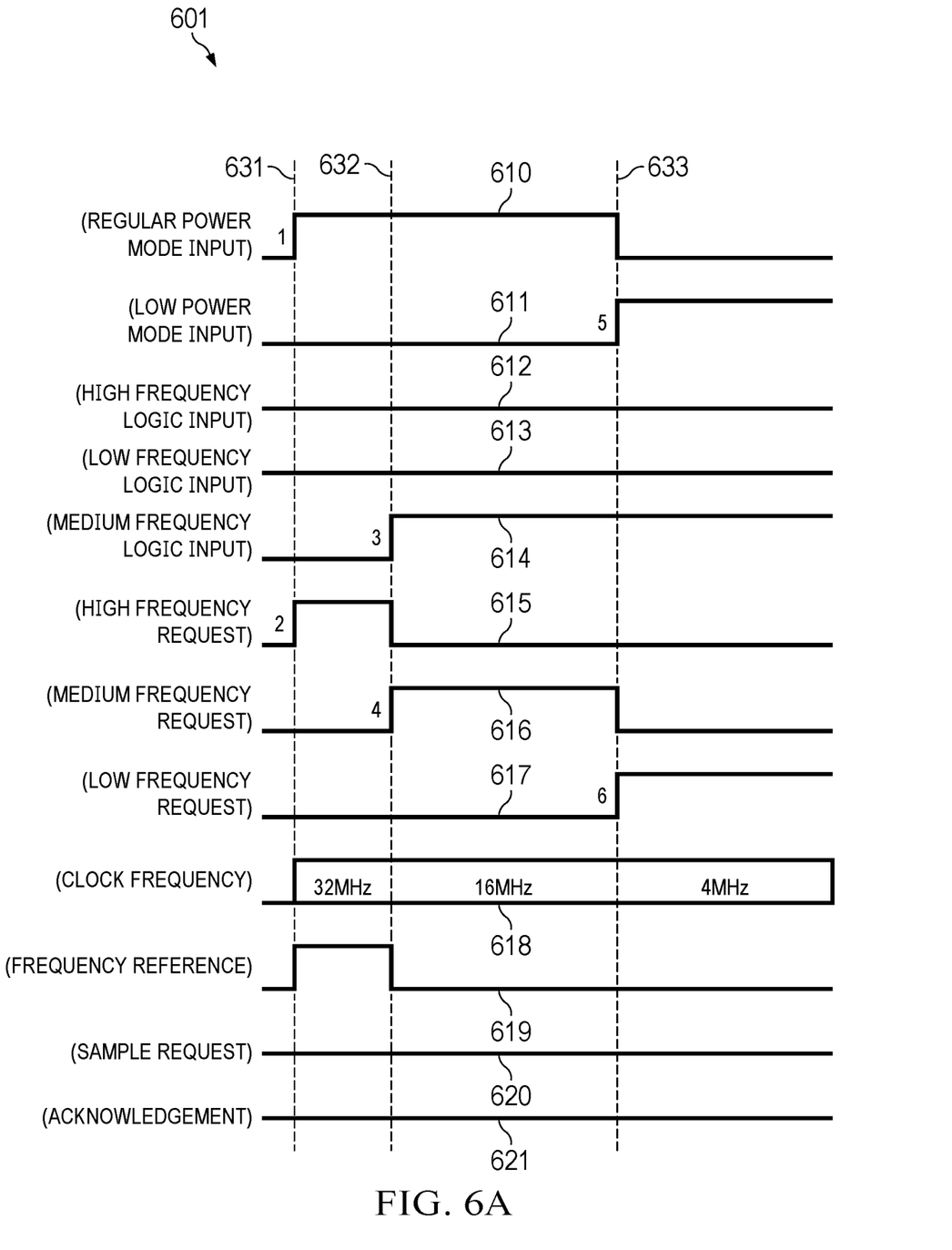
FIGS. 6A, 6B, 6C, and 6D illustrate example graphical representations of adaptive clock management in an implementation.

In digital waveform 601 illustrated in FIG. 6A, at time 631, regular power mode input 610 can be supplied to a clock subsystem for the clock subsystem to enter a run mode. When regular power mode input 610 turns "on," the clock controller can provide high frequency request 615 to the oscillator. Accordingly, the oscillator can generate clock frequency 618 at 32 MHz, and the clock controller can provide frequency reference 619 to an analog-to-digital converter subsystem indicating that clock frequency 618 is in a "high" state (i.e., that clock frequency is at 32 MHz).

Next, at time 632, the clock controller reads that medium frequency logic input 614 is "on." Consequently, high frequency request 615 turns "off" and medium frequency request turns "on." The clock controller requests the oscillator to transition clock frequency 618 from 32 MHz to 16 MHz, which turns frequency reference 619 "off" as the oscillator is no longer generating a clock signal at a high frequency.

Lastly, at time 633, the clock controller is supplied with low power mode input 611, which causes the clock controller to turn regular power mode input 610 "off" and turn low power mode input 611 "on." The clock controller then stops providing medium frequency request 615, and instead, provides low frequency request 617. When the oscillator receives low frequency request 617, it transitions clock frequency 618 from 16 MHz to 4 MHz.

Figure 6B:
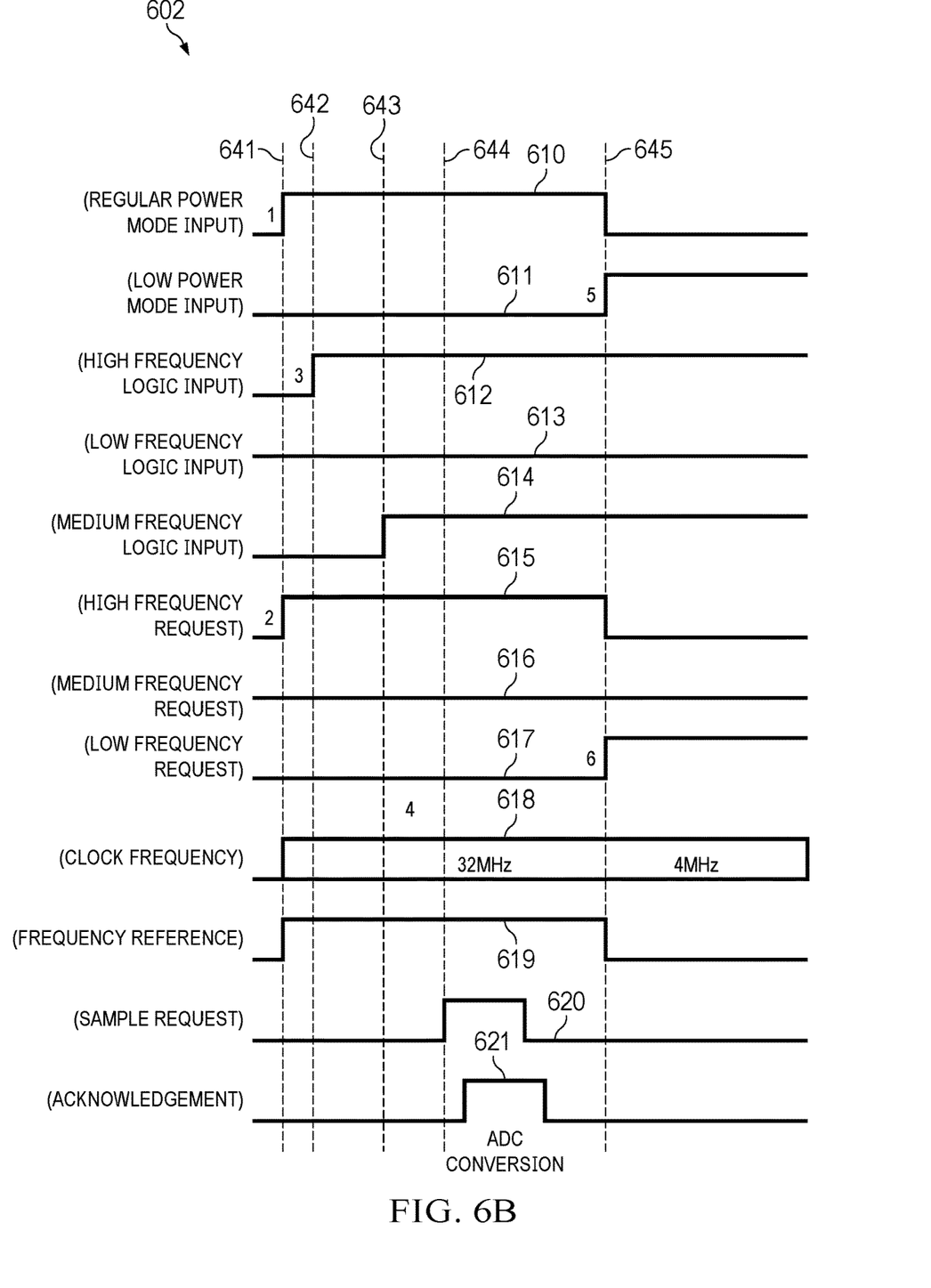

In digital waveform 602 of FIG. 6B, at time 641, the clock controller is supplied with regular power mode input 610. When regular power mode input 610 turns "on," the clock controller provides high frequency request 615 to the oscillator requesting the oscillator to generate a clock signal with clock frequency 618 of 32 MHz. Then, the clock controller can provide frequency reference 619 to the analog-to-digital converter subsystem indicating that clock frequency 618 is "high."

Next, at time 642, while the clock subsystem is still in a run mode, the clock controller can read that high frequency logic input 612 is in an "on" state. While the clock subsystem may not take any immediate action under the current state of other inputs, the high frequency logic input 612 may cause the clock controller to continue instructing the oscillator to generate a high frequency clock signal while regular power mode input 610 is "on" despite the states of other digital logic inputs. For example, at time 643, clock controller reads that medium frequency logic input 614 is in an "on" state. However, because high frequency logic input 612 may override medium frequency logic input 614 when both are "on," the clock subsystem continues to generate a clock signal at clock frequency 618 of 32 MHz.

At time 644, the clock controller reads sample request 620 from the analog-to-digital converter subsystem. Sample request 620 is a request from the analog-to-digital converter subsystem to the clock subsystem to generate a clock signal at a desired frequency (e.g., 32 MHz). In response to reading sample request 620, the clock controller may ordinarily submit high frequency request 615 to the oscillator, but with high frequency request 615 already in an "on" state, and the clock frequency 618 already at the desired frequency, the clock controller may persist high frequency request 615. Some time after sample request 620 is read, the clock controller can provide acknowledgement 621 to the analog-to-digital converter subsystem. Acknowledgement 621 is an indication that the clock subsystem is generating the clock signal at the desired frequency based on sample request 620. In some cases, such as in here, when the clock signal is already at the desired frequency, and consequently, frequency reference 619 provides the indication thereof, the analog-to-digital converter subsystem need not wait for acknowledgement 621 before operating.

Lastly, at time 645, the clock controller is supplied with low power mode input 611, which causes the clock controller to turn regular power mode input 610 "off" and turn low power mode input 611 "on." The clock controller then stops providing medium frequency request 615, and instead, provides low frequency request 617. When the oscillator receives low frequency request 617, it transitions clock frequency 618 from 32 MHz to 4 MHz and frequency reference 619 changes to a "low" state.

Figure 6C:
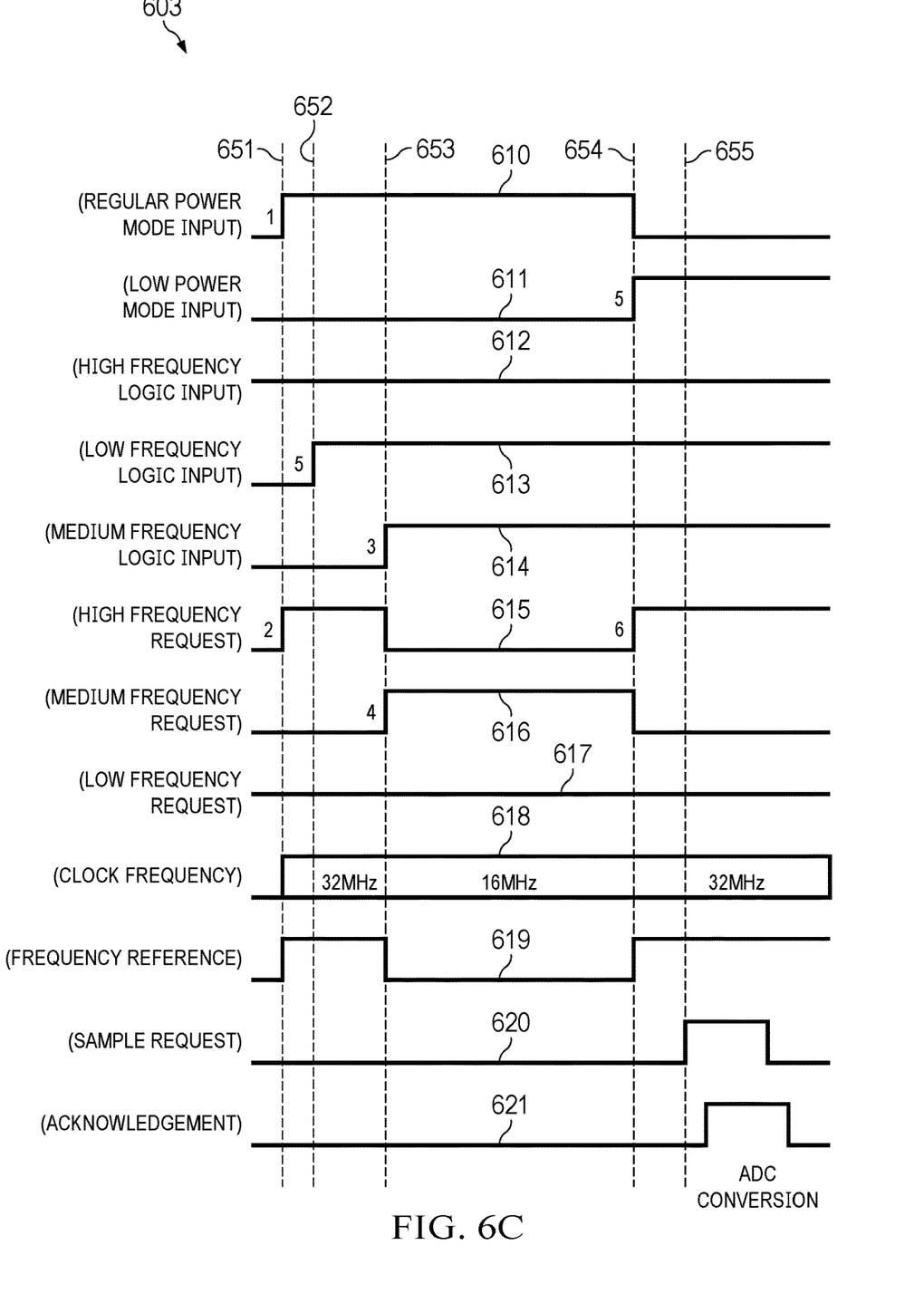

In digital waveform 603 of FIG. 6C, at time 651, regular power mode input 610 can be supplied to a clock subsystem for the clock subsystem to enter a run mode. When regular power mode input 610 turns "on," the clock controller can provide high frequency request 615 to the oscillator. Accordingly, the oscillator can generate clock frequency 618 at 32 MHz, and the clock controller can provide frequency reference 619 to an analog-to-digital converter subsystem indicating that clock frequency 618 is in a "high" state (i.e., that clock frequency is at 32 MHz).

At time 652, the clock controller reads that low frequency logic input 613 is in an "on" state. While low frequency logic input 613 has no immediate effect under the circumstances, when low frequency logic input 613 is "on" and low power mode input 611 is "on," the clock controller can provide high frequency request 615 to ensure that the oscillator generates a high frequency clock signal.

Next, at time 653, the clock controller reads that medium frequency logic input 614 is "on." Consequently, high frequency request 615 turns "off" and medium frequency request turns "on." The clock controller requests the oscillator to transition clock frequency 618 from 32 MHz to 16 MHz, which turns frequency reference 619 "off" as the oscillator is no longer generating a clock signal at a high frequency.

At time 654, the clock controller is supplied with low power mode input 611, which causes the clock controller to turn regular power mode input 610 "off" and turn low power mode input 611 "on." The clock controller then stops providing medium frequency request 615, but instead of providing low frequency request 617, the clock controller provides high frequency request 615 due to low frequency logic input 613 being "on." Accordingly, because high frequency request 615 is "on," the oscillator can generate the clock signal at clock frequency 618 of 32 MHz, and the clock controller can set frequency reference 619 to "high."

Lastly, at time 655, the clock controller reads sample request 620 from the analog-to-digital converter subsystem. Sample request 620 is a request from the analog-to-digital converter subsystem to the clock subsystem to generate a clock signal at a desired frequency (e.g., 32 MHz). In response to reading sample request 620, the clock controller may ordinarily submit high frequency request 615 to the oscillator, but with high frequency request 615 already in an "on" state, and the clock frequency 618 already at the desired frequency, the clock controller may persist high frequency request 615. Some time after sample request 620 is read, the clock controller can provide acknowledgement 621 to the analog-to-digital converter subsystem for the analog-to-digital converter subsystem to begin converting despite low power mode input 611 being "on."

Figure 6D:
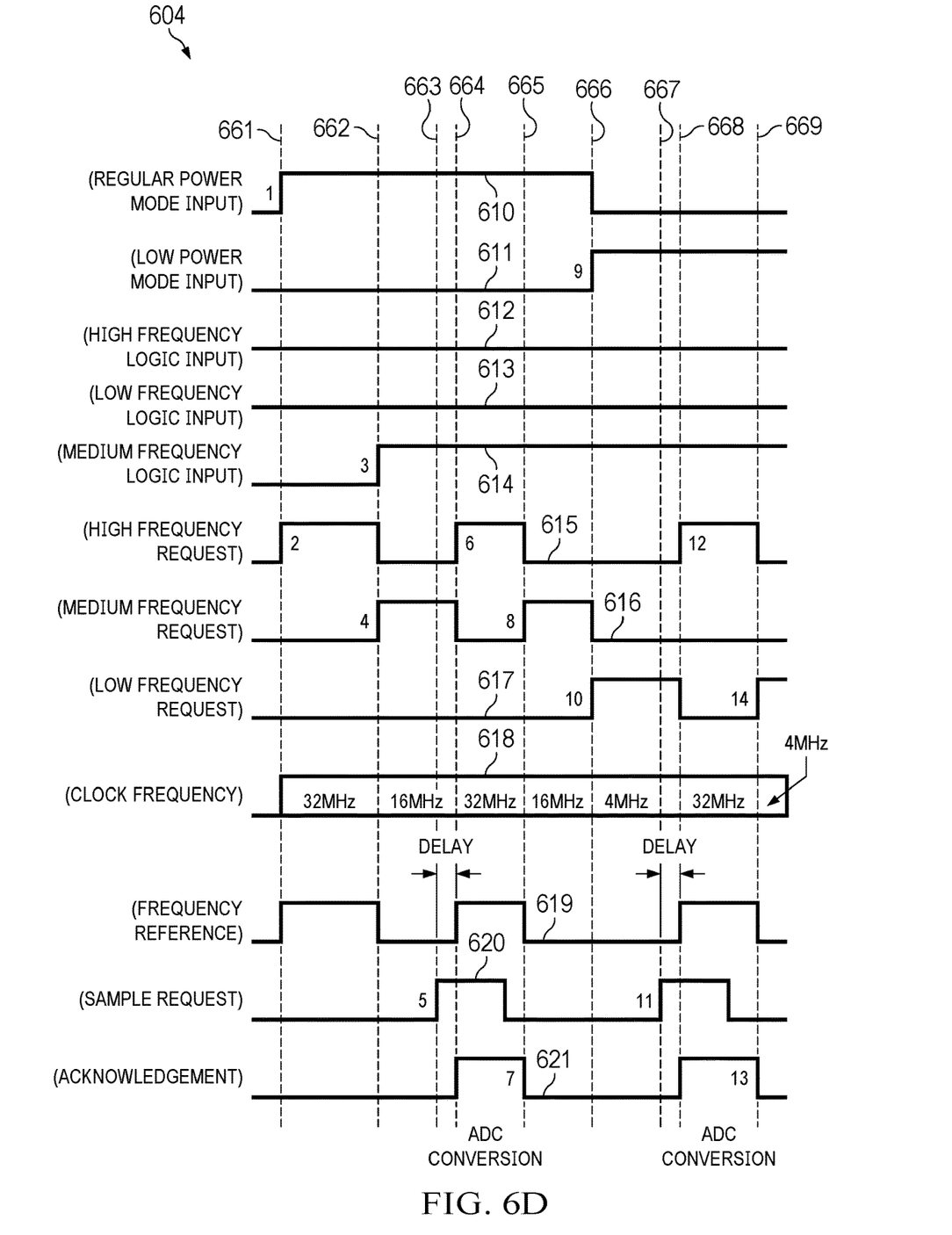

In digital waveform 604 of FIG. 6D, at time 661 regular power mode input 610 can be supplied to a clock subsystem for the clock subsystem to enter a run mode. When regular power mode input 610 turns "on," the clock controller can provide high frequency request 615 to the oscillator. Accordingly, the oscillator can generate clock frequency 618 at 32 MHz, and the clock controller can provide frequency reference 619 to an analog-to-digital converter subsystem indicating that clock frequency 618 is in a "high" state (i.e., that clock frequency is at 32 MHz).

At time 662, the clock controller reads that medium frequency logic input 614 is "on." Consequently, high frequency request 615 turns "off" and medium frequency request turns "on." The clock controller requests the oscillator to transition clock frequency 618 from 32 MHz to 16 MHz, which turns frequency reference 619 "off" as the oscillator is no longer generating a clock signal at a high frequency.

At time 663, the clock controller reads sample request 620 from the analog-to-digital converter subsystem. However, at this time, frequency reference 619 is not "high" so the analog-to-digital converter subsystem cannot begin operating immediately. Instead, there may be some delay between sample request 620 and any conversion to allow the clock subsystem to transition clock frequency 618 to the desired frequency. Shortly after sample request 620 is received, the clock controller can set high frequency request 615 to "on" and medium frequency request 616 to "off." This allows the oscillator to transition clock frequency 618 from 16 MHz to 32 MHz. Then, frequency reference 619 can be set "high" and acknowledgement 621 can be provided to the analog-to-digital converter subsystem.

At time 665, sample request 620 turns "off" allowing medium frequency logic input 614, which is still "on," to control clock frequency 618 again. Consequently, medium frequency request 616 turns "on," high frequency request 615 turns "off," and clock frequency 618 shifts from 32 MHz to 16 MHz.

Next, at time 666, the clock controller is supplied with low power mode input 611, which causes the clock controller to turn regular power mode input 610 "off" and turn low power mode input 611 "on." The clock controller then stops providing medium frequency request 615, and instead, provides low frequency request 617. When the oscillator receives low frequency request 617, it transitions clock frequency 618 from 16 MHz to 4 MHz and frequency reference 619 changes to a "low" state.

At time 667, sample request 620 once again turns "on," but because clock frequency 618 is at 4 MHz, the analog-to-digital converter subsystem can wait for either frequency reference 619 or acknowledgement 621 to be set "high" before performing conversion operations. After some delay, high frequency request 615 is turned "on" and low frequency request 617 is turned "off" at time 668. The oscillator can then produce the clock signal at clock frequency 618 of 32 MHz causing frequency reference 619 and acknowledgement 621 to turn "high."

Following any conversion operations, sample request 620 once again turns "off," and at time 669, the clock subsystem can function in low power mode given low power mode input 611 is still "on." This means that high frequency request 615 turns "off," low frequency request 617 turns "on" and clock frequency 618 transitions to 4 MHz. During this time, acknowledgement 621 and frequency reference 619 both turn "low" as to indicate clock frequency 618 is not high to the analog-to-digital converter subsystem.

It may be appreciated that digital waveforms 601, 602, 603, and 604 demonstrate only a few examples of how a clock subsystem and an analog-to-digital converter subsystem function individually and together based on multiple inputs. Other combinations and variations of inputs may be contemplated but are not discussed herein for the sake of brevity.

While some examples provided herein are described in the context of a clock subsystem, peripheral, architecture, or environment, it should be understood that the clock subsystems, analog-to-digital converter subsystems, and other systems and methods described herein are not limited to such embodiments and may apply to a variety of other processes, systems, applications, devices, and the like. As will be appreciated by one skilled in the art, aspects of the present invention may be embodied as a system, method, computer program product, and other configurable systems. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The phrases "in some embodiments," "according to some embodiments," "in the embodiments shown," "in other embodiments," and the like generally mean the particular feature, structure, or characteristic following the phrase is included in at least one implementation of the present technology, and may be included in more than one implementation. In addition, such phrases do not necessarily refer to the same embodiments or different embodiments.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited as a computer-readable medium claim, other aspects may likewise be embodied as a computer-readable medium claim, or in other forms, such as being embodied in a means-plus-function claim. Any claims intended to be treated under 35 U.S.C. § 112(f) will begin with the words "means for" but use of the term "for" in any other context is not intended to invoke treatment under 35 U.S.C. § 112(1). Accordingly, the applicant reserves the right to pursue additional claims after filing this application to pursue such additional claim forms, in either this application or in a continuing application.

What is claimed is:

1. A clock subsystem, comprising:
   an oscillator configured to provide a clock signal at one of a plurality of frequencies; and
   a controller coupled to the oscillator and configured to:
      determine a desired frequency of the clock signal based on a state of each input of multiple inputs, wherein the multiple inputs comprise a power mode input and an analog-to-digital converter input, and wherein the power mode input is in one among a regular-power mode state and a low-power mode state; and
      provide a signal to the oscillator to produce the clock signal at the desired frequency.

2. The clock subsystem of claim 1, wherein the controller is further configured to provide an indication of the clock signal to an analog-to-digital converter.

3. The clock subsystem of claim 2, wherein the oscillator is configured to provide the clock signal at the desired frequency to the analog-to-digital converter.

4. The clock subsystem of claim 2, wherein, in response to determining that the clock signal is at the desired frequency based on the indication, the analog-to-digital converter is configured to convert an analog signal using the clock signal.

5. The clock subsystem of claim 1, wherein the multiple inputs further comprises a logic input comprising multiple states, and wherein at least one state of the multiple states influences the desired frequency when the power mode input is in the regular-power mode state and at least one other state of the multiple states influences the desired frequency when the power mode input is in the low-power mode state.

6. The clock subsystem of claim 1, wherein the analog-to-digital converter input is in one among a convert state and a rest state, and wherein the analog-to-digital converter input enters the convert state when the controller of the clock subsystem receives a request to produce the clock signal for an analog-to-digital converter.

7. A system, comprising:
an analog-to-digital converter (ADC) subsystem; and
a clock subsystem coupled to the ADC subsystem and configured to provide a clock signal;
wherein the ADC subsystem is configured to provide a request to the clock subsystem to produce the clock signal at a desired frequency; and
wherein the clock subsystem is configured to:
receive the request and a power mode input that is in one among a regular-power mode state and a low-power mode state;
determine the desired frequency based on the request and the power mode input;
produce, via an oscillator unit of the clock subsystem, the clock signal at the desired frequency; and
provide the clock signal to the ADC subsystem.

8. The system of claim 7, wherein the clock subsystem comprises the oscillator unit configured to provide the clock signal at one of a plurality of frequencies and a clock controller coupled to the oscillator unit and configured to control the oscillator unit.

9. The system of claim 7, wherein the ADC subsystem comprises circuitry configured to convert an analog signal to a digital signal based on the clock signal and an ADC controller coupled to the circuitry and configured to instruct the circuitry to convert the analog signal to the digital signal.

10. The system of claim 9, wherein the circuitry of the ADC subsystem is further configured to provide the digital signal to a peripheral.

11. The system of claim 7, wherein the desired frequency corresponds to a sampling rate capable of converting an analog signal to a digital signal.

12. The system of claim 7, wherein the desired frequency is determined further based on a state of each input of multiple inputs to the clock subsystem, and wherein the multiple inputs comprise a logic input.

13. The system of claim 12, wherein the logic input is in one among multiple frequency states, and wherein at least one frequency state of the multiple frequency states influences the desired frequency when the power mode input is in the regular-power mode state and at least one other frequency state of the multiple frequency states influences the desired frequency when the power mode Input is in the low-power mode state.

14. A method, comprising:
in an analog-to-digital converter, in response to a trigger to convert an analog signal to a digital signal, providing a request to a clock subsystem to produce a clock signal at a first frequency;
in the clock subsystem,
receiving the request and a power mode input associated with a second frequency of the clock signal;
producing the clock signal at the first frequency regardless of whether the second frequency is equal or not equal to the first frequency; and
in the analog-to-digital converter, converting the analog signal to the digital signal based on the clock signal at the first frequency.

15. The method of claim 14, further comprising, in the clock subsystem, providing an indication to the analog-to-digital converter that the clock signal is provided at the first frequency.

16. The method of claim 15, further comprising, in the clock subsystem, providing an acknowledgement to the analog-to-digital converter in response to the request.

17. The method of claim 16, further comprising, in the analog-to-digital converter, converting the analog signal to the digital signal based on determining that the indication is received, regardless of whether the acknowledgement is received.

18. The method of claim 14, wherein the power mode input is in one among a regular-power mode state and a low-power mode state associated with respective frequencies of the clock signal.

19. The method of claim 18, further comprising, in the clock subsystem, producing the clock signal based on a logic input, wherein the logic input is in one among multiple frequency states, and wherein at least one frequency state of the multiple frequency states influences the first frequency when the power mode input is in the regular-power mode state and at least one other frequency state of the multiple frequency states influences the first frequency when the power mode input is in the low-power mode state.

20. The clock subsystem of claim 6, wherein the analog-to-digital converter input is provided to the controller in response to a trigger to convert an analog signal to a digital signal.

* * * * *